United States Patent [19]

Tamura

[11] Patent Number: 5,360,756
[45] Date of Patent: Nov. 1, 1994

[54] METHOD OF MANUFACTURING A SEMICONDUCTOR DEVICE HAVING A MONOCRYSTAL SILICON LAYER

[75] Inventor: Katsuhiko Tamura, Hyogo, Japan

[73] Assignee: Mitsubishi Denki Kabushiki Kaisha, Tokyo, Japan

[21] Appl. No.: 160,717

[22] Filed: Dec. 2, 1993

[30] Foreign Application Priority Data

Jan. 20, 1993 [JP] Japan .................. 5-007796

[51] Int. Cl.[5] .......................... H01L 21/265
[52] U.S. Cl. ........................... 437/43; 437/49;
                                       437/101; 437/233
[58] Field of Search ............... 437/43, 49, 101, 233

[56] References Cited

U.S. PATENT DOCUMENTS 4,748,133  5/1988  Griswold .................... 437/43
4,868,619  9/1989  Mukherjee et al. ........... 257/300

FOREIGN PATENT DOCUMENTS 58-158973   9/1983  Japan .
59-198765  11/1984  Japan .
60-5569     1/1985  Japan .
62-194617   8/1987  Japan .
3-253072    1/1991  Japan .
4-119648    4/1992  Japan .

Primary Examiner—R. Bruce Breneman
Assistant Examiner—Ramamohan Rao Paladugu
Attorney, Agent, or Firm—Lowe, Price, LeBlanc & Becker

[57] ABSTRACT

According to a method of manufacturing a semiconductor device, a monocrystal silicon layer can be formed easily without adversely affecting semiconductor elements. In the method of manufacturing the semiconductor device, a first polysilicon layer is formed on a gate oxide film layer on a silicon substrate, and then a resist is formed on a predetermined region of the first polysilicon layer. Using the resist as a mask, anisotropic etching is effected to expose the surface of the silicon substrate. Thereby, it is not necessary to form the resist directly on the gate oxide film layer, as is done in the prior art, and it is possible to prevent impurity such as sodium or phosphorus in the resist from entering the gate oxide film layer. Consequently, it is possible to prevent a disadvantage such as change of a threshold voltage of a memory cell transistor, which may be caused by the entry of impurity.

11 Claims, 28 Drawing Sheets

METHOD OF MANUFACTURING A SEMICONDUCTOR DEVICE HAVING A MONOCRYSTAL SILICON LAYER

BACKGROUND OF THE INVENTION

FIELD OF THE INVENTION

The present invention relates to a method of manufacturing a semiconductor device, and in particular, to a method of manufacturing a semiconductor device capable of electrically writing and erasing information.

DESCRIPTION OF THE BACKGROUND INVENTION

As is well know, an EEPROM (Electrically Erasable and Programmable Read Only Memory) is a kind of nonvolatile semiconductor device capable of electrically writing and erasing information. Although the EEPROM has an advantage that both the writing and erasing operations can be electrically performed, it has a disadvantage that integration thereof to a high extent is difficult because each memory cell requires two transistors. In view of this, there has been proposed, for example, in U.S. Pat. No. 4,868,619, a flash EEPROM including memory cells, each of which is formed of one transistor, and which can electrically and simultaneously erase information charges written thereinto.

FIG. 57 is a block diagram showing a general structure of a flash EEPROM in the prior art. Referring to FIG. 57, the flash EEPROM includes a memory cell array 130 in which a plurality of memory cells (not shown) for storing data are arranged in a matrix form, an X-decoder 131 and a Y-decoder which decode an externally applied address signal for selecting a row and a column in the memory cell array 130, respectively, a Y-gate 133, an I/O circuit 135 connected to the Y-gate 133 for input and output of data, and a control circuit 134 connected to the Y-gate 133 and I/O circuit 135 for controlling an operation of the flash EEPROM based on an externally applied control signal. The X-decoder 131, Y-decoder 132, Y-gate 133, control circuit 134, I/O circuit 135 and memory cell array 130 are formed on a common substrate in a semiconductor chip 136. The semiconductor chip 136 is further provided with a power input terminal $V_{cc}$ 137 and a high voltage power supply terminal $V_{pp}$ 138.

FIG. 58 is an equivalent circuit diagram showing a schematic structure of the memory cell array 130 shown in FIG. 57. Referring to FIG. 58, there are arranged in the memory cell array 130 a plurality of word lines $WL_1, WL_2, \ldots, WL_i$ extending in a row direction and a plurality of bit lines $BL_1, BL_2, \ldots, BL_i$ extending in a column direction perpendicular to the row direction. Memory cell transistors $Q_{11}, Q_{12}, \ldots, Q_{ii}$ each having a floating gate are disposed at respective crossings of the word lines and bit lines. Each memory cell transistor has a drain connected to the corresponding bit line, and a control gate connected to the corresponding word line. Sources of the memory cell transistors are connected to corresponding source lines $SL_1, SL_2, \ldots$, which are connected to source lines $S_1, S_2, \ldots$, disposed at opposite sides thereof.

FIG. 59 is a cross section showing one memory cell (semiconductor memory element) portion including one memory cell transistor shown in FIG. 58. The flash EEPROM having the memory cell structure shown in FIG. 59 is referred to as a stacked gate flash EEPROM.

Referring to FIG. 59, the memory cell of the stacked gate flash EEPROM in the prior art includes a silicon substrate 101, source and drain impurity diffusion layers 106 and 107 formed in a main surface of the silicon substrate 101 with a space between each other, a channel region 111 formed between the source and drain impurity diffusion layers 106 and 107, a gate oxide film 102 formed on the channel region 111 and made of $SiO_2$, a floating gate electrode 103 formed on the gate oxide film 102 and made of a monocrystal silicon layer, an insulating film 104 formed on the floating gate electrode 103, a control gate electrode 105 formed on the insulating film 104 and made of a polysilicon layer, an interlayer thermal oxidation film 108 covering the control gate electrode 105, an interlayer insulating film 109 covering the interlayer thermal oxidation film 108, and a metal interconnection layer 110 formed along the interlayer insulating film 109.

The gate oxide film 102, floating gate electrode 103, insulating film 104, control gate electrode 105, drain impurity diffusion layer 106 and source impurity diffusion layer 107 form basic elements of the stacked gate EEPROM. The interlayer insulating film 109 contains impurity such as boron or phosphorus. The purpose of the interlayer thermal oxidation film 108 is to prevent entry of impurity such as boron or phosphorus into the silicon substrate 101, control gate electrode 105 and/or floating gate electrode 103, which may change electrical characteristics thereof. The floating gate electrode 103 is made of the monocrystal silicon layer by following reasons. If the floating gate electrode 103 were made of a polysilicon layer, the floating gate electrode 103 would have uneven surface because the polysilicon layer has a plurality of grains. Therefore, an electric field would concentrate at convex portions of the surface of the floating gate electrode 103 when a voltage were applied to the source impurity diffusion layer in an erasing operation which will be described later. As a result, electrons stored in the floating gate electrode 133 would be excessively drawn therefrom, and in other words, an over-erase phenomenon would generate. Accordingly, the floating gate electrode 103 is made of the monocrystal silicon layer in order to eliminate the unevenness. Since the monocrystal silicon layer does not have unevenness, which is different from the polysilicon, concentration of electric field does not generate in the erasing operation, and thus the over-erase phenomenon, which may be caused by the concentration of electric field, can be effectively prevented.

FIG. 60 is a schematic cross section for showing an operation of the conventional EEPROM. Referring to FIG. 60, the operation will now be described below. The flash EEPROM performs the operations in the write/erase modes for electrically writing and erasing information and in the read mode for reading information. The write/erase modes are classified into the write mode for electrically writing information and the erase mode for electrically erasing information.

In the erase mode, the drain electrode formed of the drain impurity diffusion layer 107 is set, e.g., at the floating state, and the control gate electrode 105 is set at the grounded state. A high voltage of about 12 V is applied to the source electrode formed of the source impurity diffusion layer 106. Thereby, electrons stored in the floating gate electrode 103 are drawn toward the source impurity diffusion layer 106. The current caused by this draw is referred to as the Fowler-Nordheim tunnel current.

In the write mode, the source electrode formed of the source impurity diffusion layer 106 is set at the grounded state. A voltage, e.g., of 7 V is applied to the drain electrode formed of the drain impurity diffusion layer 107, and a voltage, e.g., of 12 V is applied to the control gate electrode 105. Thereby, avalanche phenomenon is generated at the vicinity of a portion of the drain impurity diffusion layer 107 located under the end of the floating gate electrode 103. Hot electrons generated by the avalanche phenomenon move into the floating gate electrode 103 through the gate oxide film 102. Thereby, information is written into the memory cell.

In the reading mode, the source electrode formed of the source impurity diffusion layer 106 is set at the grounded state. A voltage, e.g., of 1 V is applied to the drain electrode formed of the drain impurity diffusion layer 107, and a voltage, e.g., of 3 V is applied to the control gate electrode 105. While maintaining this state, it is determined whether a current flows from the drain impurity diffusion layer 107 to the source impurity diffusion layer 106 or not, whereby the states of "1" and "0" are discriminated for reading information. More specifically, in the case where the floating gate 103 has stored the electrode, the current does not flow from the drain impurity diffusion layer 107 to the source impurity diffusion layer 106. As a result, the written state is read. Meanwhile, in the case where electrons have been drawn from the floating gate electrode 103, the current flows from the drain impurity diffusion layer 107 to the source impurity diffusion layer 106. As a result, the erased state is read.

FIGS. 61-71 are cross sections for showing a process of manufacturing the conventional flash EEPROM shown in FIG. 59. Referring to FIG. 59 and FIGS. 61-71, the process of manufacturing the memory cell part of the conventional flash EEPROM will be described below.

FIG. 61 shows an initial state of the silicon substrate 101, on which a gate oxide film layer 102a of about 120 Å in thickness is formed by the thermal oxidation method as shown in FIG. 62. A resist 112 is formed on a predetermined region of the gate oxide film layer 102a. Using the resist 112 as a mask, the gate oxide film layer 102a is patterned to expose the surface of the silicon substrate 101 as shown in FIG. 63. Thereafter, the resist 112 is removed.

As shown in FIG. 64, a polysilicon layer 103a of about 2000 Å in thickness is formed by the CVD method on the exposed surface of the silicon substrate 101 and the gate oxide film layer 102a. The polysilicon layer 103a is heated and melted, e.g., by the laser anneal method, whereby the polysilicon layer 103a is monocrystallized using the silicon (monocrystal) substrate 101 as seed crystal. In this manner, a monocrystal silicon layer 103b shown in FIG. 65 is obtained.

Then, as shown in FIG. 66, an insulating film layer 104a of about 300 Å in thickness is formed on the monocrystal silicon layer 103b, and then a polysilicon layer 105a of about 3000 Å in thickness is formed on the insulating film layer 104a by the CVD method. Using the resist 113 as a mask, anisotropic etching is effected on the polysilicon layer 105a, insulating film layer 104a, monocrystal silicon layer 103b and gate oxide film layer 102a to form the control gate electrode 105, insulating film 104, floating gate electrode 103 and gate oxide film 102 shown in FIG. 67. Thereafter, the resist 113 is removed.

As shown in FIG. 68, impurity is ion-implanted into the silicon substrate 101 with implantation energy of about $3 \times 10^{15}/cm^2$ using the control gate electrode 105 as a mask, and then is thermally diffused, so that the source impurity diffusion layer 106 and drain impurity diffusion layer 107 are formed.

Then, as shown in FIG. 69, the interlayer thermal oxidation film 108 of about 3000 Å in thickness is formed to cover the silicon substrate 101, control gate electrode 105 and floating gate electrode 103.

Then, as shown in FIG. 70, the interlayer insulating film 109 covering the interlayer thermal oxidation film 108 is formed to have a thickness of about 7000 Å. Then, thermal treatment is effected to improve flatness of the interlayer insulating film 109. Thereby, the interlayer insulating film 109 having a configuration shown in FIG. 71 is completed.

Finally, as shown in FIG. 59, the metal interconnection layer 110 of about 1000 Å in thickness is formed on the interlayer insulating film 109, e.g., by the spatter method to form an electrical connection (not shown) to the drain impurity diffusion layer 107.

In this manner, the memory cell part of the conventional EEPROM is completed.

In the conventional method of manufacturing the memory cell part of the flash EEPROM, it is necessary to pattern the gate oxide film layer 102a in the steps shown in FIGS. 62 and 63 to expose the silicon substrate 101 in order to form the floating gate electrode 103 made of the monocrystal silicon layer. In order to pattern the gate oxide film layer 102a, the resist 112 is formed directly on the gate oxide film layer 102a. This may cause a disadvantage that impurity such as sodium (Na) or phosphorus (P) contained in the resist 112 enters the gate oxide film layer 102a. More specifically, the impurity, and particularly, sodium contained in the resist 112 adheres to the surface of the gate oxide film layer 102a in the steps shown in FIGS. 62 and 63. The sodium adhered to the upper surface of the gate oxide film layer 102a generates movable electrons in accordance with increase of temperature during formation of the polysilicon layer 103a shown in FIG. 64. As a result, the sodium enters the gate oxide film layer 102a. FIG. 72 is a cross section for showing a problem of the conventional process of manufacturing the flash EEPROM. Referring to FIG. 72, if the sodium (Na) is heated for a long time period, the sodium penetrates the gate oxide film 102 and are gathered at an interface between the gate oxide film 102 and the surface of the silicon substrate 101. Thereby, a sodium ion ($Na^+$) layer 150 is formed on the channel region 111 in the silicon substrate 101, so that a threshold voltage $VT_{TH}$ Of the memory cell transistor disadvantageously changes. The change of the threshold voltage $V_{TH}$ of the memory cell transistor may cause problems such as an over-erase phenomenon by which electrons in the floating gate electrode 103 are excessively drawn during the erasing operation. In the prior art, since the resist 112 is formed directly on the gate oxide film layer 102a (see FIG. 62) in a series of steps for forming the floating gate electrode 103 consisting of the monocrystal silicon layer, characteristics of elements are adversely affected, as described above.

SUMMARY OF THE INVENTION

An object of the invention is to provide a method of manufacturing a semiconductor device, in which a monocrystal silicon layer is formed without adversely affecting elements.

Another object of the invention is to provide a method of manufacturing a semiconductor device in which impurity contained in a resist is prevented from entering an insulating film located under a monocrystal silicon layer.

According to an aspect of the invention, a method of manufacturing a semiconductor device includes the steps of forming an insulating film on a silicon substrate, forming a first non-monocrystal silicon layer on the insulating film, patterning the first non-monocrystal silicon layer and the insulating film to expose a predetermined portion of a surface of the silicon substrate, forming a second non-monocrystal silicon layer on the first non-monocrystal silicon layer and the exposed portion of the surface of the silicon substrate, and heating and melting the first non-monocrystal silicon layer and the second non-monocrystal silicon layer for monocrystallizing the first non-monocrystal silicon layer and the second non-monocrystal silicon layer.

Since the first non-monocrystal silicon layer is formed on the insulating film which is formed on the silicon substrate, and then the first non-monocrystal silicon layer and the insulating film are patterned, the resist used for the patterning is formed on the first non-monocrystal silicon layer, and is not formed directly on the insulating film. This can prevent the conventional disadvantage that impurity in the resist enters the surface of the insulating film and thereby deteriorates the characteristics of elements. As a result, the monocrystal silicon layer can be easily formed without adversely affecting the characteristics of elements.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will be described below with reference to the drawings.

Figure 1:
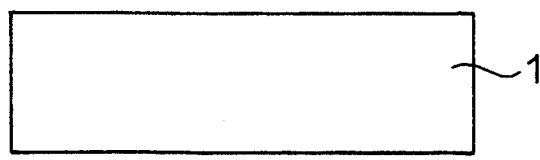
FIGS. 1-14 are cross sections showing 1st to 14th steps of a process of manufacturing a memory cell part of a flash EEPROM of a first embodiment of the invention.
Figure 2:
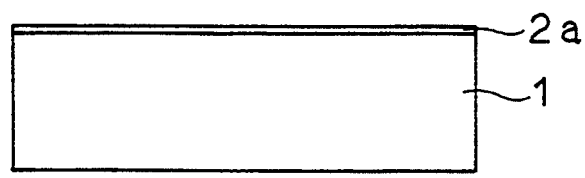

First, a manufacturing process of a first embodiment will be described below with reference to FIGS. 1-14. As shown in FIGS. 1 and 2, a gate oxide film layer 2a, i.e., silicon oxide film of about 120 Å in thickness is formed on a silicon substrate 1 using a thermal oxidation technique.

Figure 3:
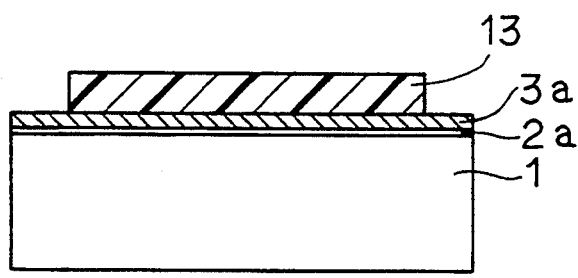
Figure 4:
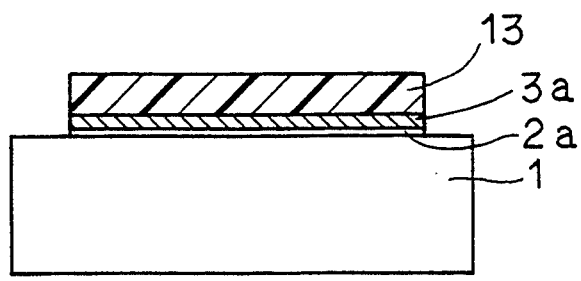

As shown in FIG. 3, a first polysilicon layer 3a of about 1000 Å in thickness is formed on the gate oxide film layer 2a using the CVD method under the conditions of the pressure of about 0.3 to 0.4 Torr and the temperature of about 900° C. Then, a resist 13 is formed on a predetermined region of the first polysilicon layer 3a. Using the resist 13 as a mask, anisotropic etching is effected on the first polysilicon layer 3a and gate oxide film layer 2a to expose the surface of the silicon substrate 1, as shown in FIG. 4.

Figure 5:
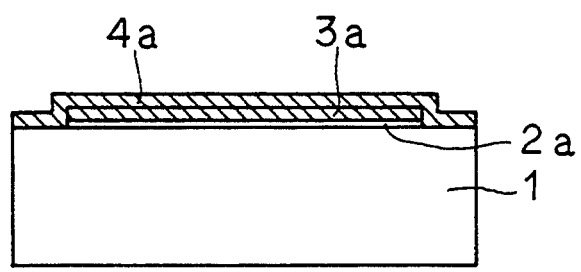
Figure 6:
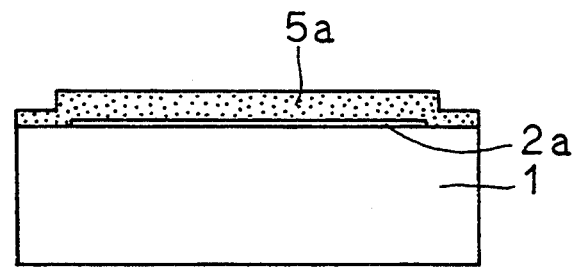

Then, as shown in FIG. 5, a second polysilicon layer 4a of about 1000 Å in thickness is formed on the exposed portion of the surface of the silicon substrate 1 and the first polysilicon layer 3a by the CVD method under the conditions of the temperature of about 900° C. and the pressure of about 0.3 to 0.4 Torr. Thereafter, laser anneal, heat treatment or lamp heating is utilized to heat and melt the second and first polysilicon layers 4a and 3a at the temperature of 1420° C. or more, whereby a monocrystal silicon layer 5a is formed utilizing the silicon (monocrystal) substrate 1 as seed crystal, as shown in FIG. 6. In the manufacturing process of the first embodiment, two-layer process with the first and second polysilicon layers 3a and 4a is used to form the monocrystal silicon layer 5a which will form the floating gate electrode. More specifically, in the patterning process for exposing the surface of the silicon substrate, the resist 13 is not formed directly on the gate oxide film layer 2a, but is formed on the first polysilicon layer 3a which has already been formed on the gate oxide film layer 2a (see FIG. 3). Using the resist 13 as a mask, the anisotropic etching is effected on the first polysilicon layer 3a and gate oxide film layer 2a to expose the surface of the silicon substrate 1. Owing to the above structure and process, impurity in the resist 13 does not adhere to the gate oxide film layer 2a, contrarily to the prior art, and thus adverse influence on characteristics of elements, which may be caused by impurity adhered to the gate oxide film layer 2a, can be prevented.

Figure 7:
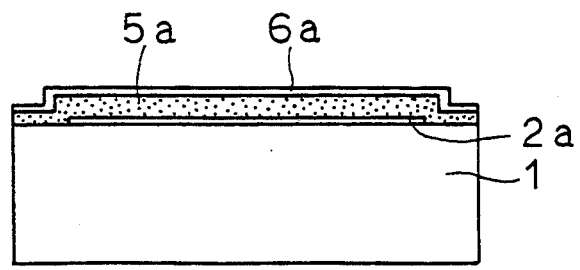

As shown in FIG. 7, an insulating film layer 6a made of a silicon oxide film of about 300 Å in thickness is formed on the monocrystal silicon layer 5a by the thermal oxidation technique.

Figure 8:
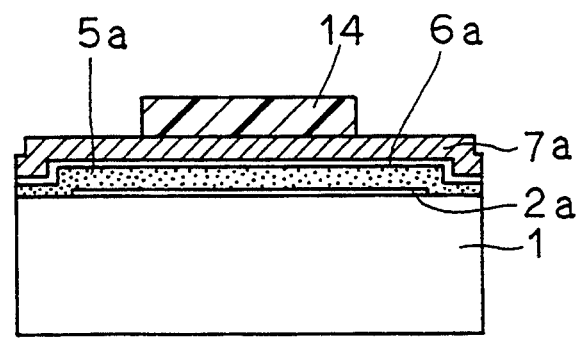
Figure 9:
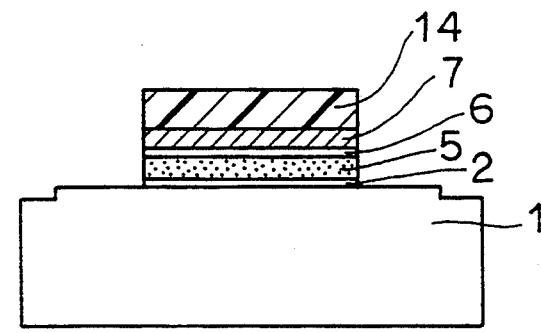

As shown in FIG. 8, a polysilicon layer 7a which has a thickness of about 3000 Å and will form a control gate electrode 7 described later is formed on the insulating film layer 6a by the CVD method. A resist 14 is formed on a predetermined region of the polysilicon layer 7a. Using the resist 14 as a mask, anisotropic etching is effected on the polysilicon layer 7a, insulating film layer 6a, monocrystal silicon layer 5a and gate oxide film layer 2a to form a gate oxide film 2, a floating gate electrode 5, an insulating film 6 and a control gate electrode 7 as shown in FIG. 9. Thereafter, the resist 14 is removed.

Figure 10:
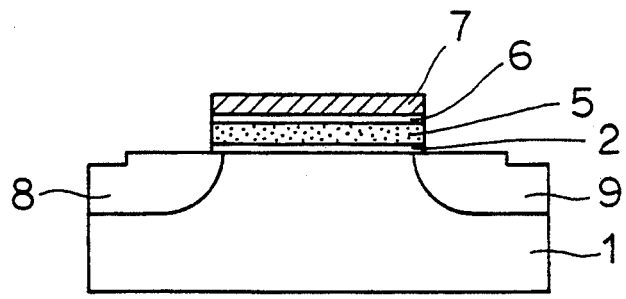

As shown in FIG. 10, impurity of which conductivity type is opposite to that of the silicon substrate 1 is ion-implanted in a self-aligned manner into the silicon substrate 1 under the implanting condition of $3 \times 10^{15}/cm^2$ using the control gate electrode 7 as a mask. The impurity thus implanted is diffused by a thermal diffusion technique. Thereby, a source impurity diffusion layer 8 and a drain impurity diffusion layer 9 are formed. In this manner, a memory cell transistor, which is formed of the source impurity diffusion layer 8, drain impurity diffusion layer 9, gate oxide film 2, floating gate electrode 5, insulating film 6 and control gate electrode 7, is completed.

Figure 11:
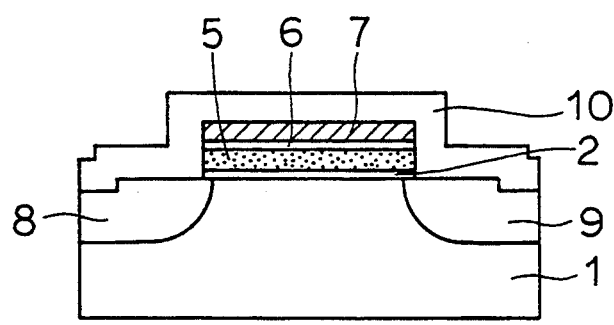
Figure 12:
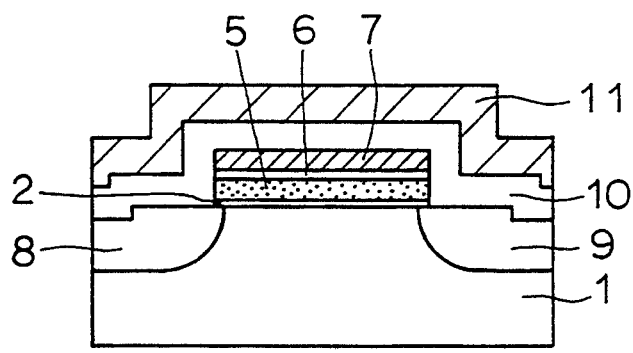
Figure 13:
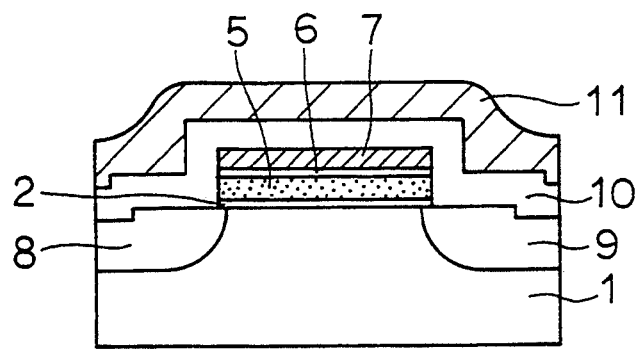

Then, as shown in FIG. 11, an interlayer thermal oxidation film 10 covering the whole surface is formed to have a thickness of about 3000 Å. As shown in FIG. 12, an interlayer insulating film 11 containing impurity such as boron or phosphorus and having a thickness of about 7000 Å is formed on the interlayer thermal oxidation film 10. As shown in FIG. 13, heat treatment, e.g., in a reflow method is effected to flatten the interlayer insulating film 11. The interlayer thermal oxidation film 10 is formed for the purpose of preventing entry of impurity such as phosphorus or boron into the silicon substrate, control gate electrode 7 and/or floating gate electrode 5.

Figure 14:
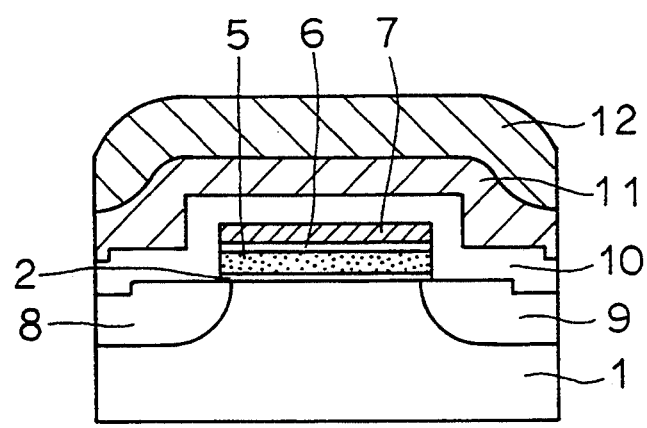

Finally, as shown in FIG. 14, a metal interconnection layer 12 of about 10000 Å in thickness, which forms an electrical connection (not shown) to the drain impurity diffusion layer 9, is formed on the interlayer insulating film 11, e.g., by the spatter method. In this manner, the floating gate electrode 5 made of monocrystal silicon can be easily manufactured without adversely affecting the element characteristics.

In the embodiment described above, the two-layer process with the first and second polysilicon layers 3a and 4a is used in order to form the floating gate electrode 5 made of monocrystal as described above, which is different from the prior art. Therefore, it is not necessary to form the resist 13 directly on the silicon oxide film layer 2a for the step patterning the silicon oxide film layer 2a so as to expose the surface of the silicon substrate 1. As a result, such a disadvantage can be prevented that impurity in the resist 13 enters the gate oxide film layer 2 and thereby adversely affects the elements. Since the first and second polysilicon layers 3a and 4a are formed by the process similar to the conventional process, no difficulty is caused in connection with the manufacturing process.

Now, a second embodiment of the manufacturing process of the invention will be described below with reference to FIGS. 15-28.

Figure 15:
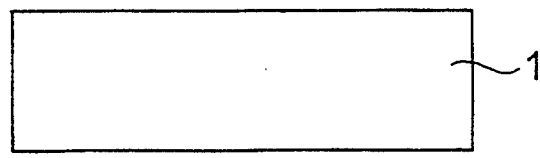
FIGS. 15-28 are cross sections showing 1st to 14th steps of a process of manufacturing a memory cell part of a flash EEPROM of a second embodiment of the invention.
Figure 16:
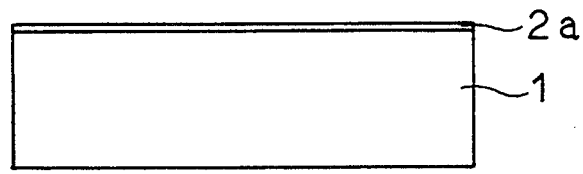

First, as shown in FIGS. 15 and 16, the gate oxide film layer 2a of about 120 Å in thickness is formed on the silicon substrate 1 using the thermal oxidation technique.

Figure 17:
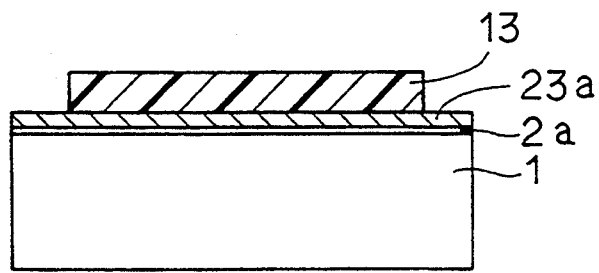

As shown in FIG. 17, a first amorphous silicon layer 23a of about 1000 Å in thickness is formed on the gate oxide film layer 2a by the CVD method under the conditions of temperature of about 550° C. or less and pressure of about 0.3 to 0.4 Torr. The resist 13 is formed on a predetermined region of the first amorphous silicon layer 23a.

Figure 18:
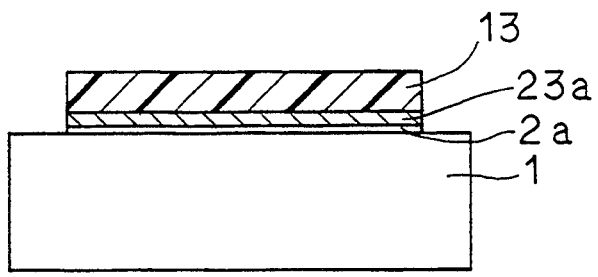

As shown in FIG. 18, anisotropic etching using the resist 13 as a mask is effected on the first amorphous silicon layer 23a and gate oxide film layer 2a to expose the surface of the silicon substrate 1. Then, the resist 13 is removed.

Figure 19:
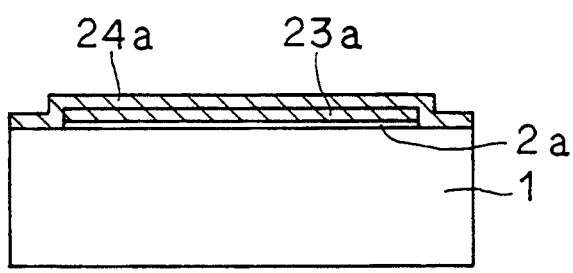
Figure 20:
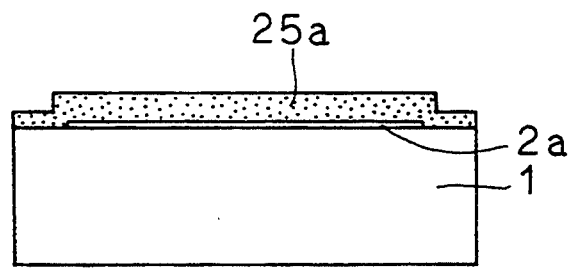

As shown in FIG. 19, a second amorphous silicon layer 24a of about 1000 Å in thickness is formed on the exposed surface of the silicon substrate 1 and the first amorphous silicon layer 23a by the CVD method under the conditions of temperature of about 550° C. or less and pressure of about 0.3 to 0.4 Torr. Then, the laser anneal method, heat treatment method or lamp heating method is used to heat and melt the second and first amorphous silicon layers 24a and 23a at the temperature above 1420° C. for monocrystallizing them using the silicon (monocrystal) substrate 1 as seed crystal. In this manner, a monocrystal silicon layer 25a is formed as shown in FIG. 20. The first and second amorphous silicon layers 23a and 24a have such an advantage that they can be monocrystallized more easily than the first and second polysilicon layers 3a and 4a. Therefore, the second embodiment has such an advantage that a time period for the monocrystallizing step can be shorter than that in the first embodiment. Also in this second embodiment, since the resist 13 is not formed directly on the gate oxide film layer 2a, which is similar to the first embodiment, but is formed on the first amorphous silicon layer 23a, such a disadvantage is prevented that impurity such as sodium or phosphorus in the resist 13 enters the gate oxide film layer 2a and thereby adversely affects the element characteristics. Thus, it is possible to prevent impurity from entering the gate oxide film layer 2a and being gathered at the surface of the silicon substrate 1, and thereby it is possible to prevent change of the threshold voltage $V_{TH}$ of the memory cell transistor. Therefore, the over-erase phenomenon, which may be caused the change of threshold voltage $V_{TH}$, can be prevented.

Figure 21:
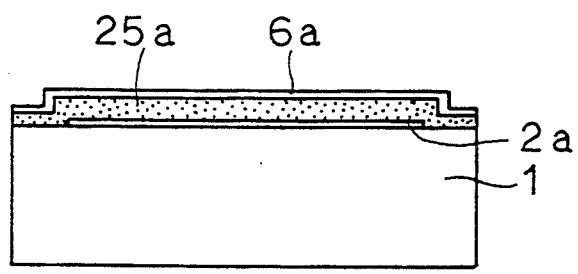

As shown in FIG. 21, the insulating film layer 6a, i.e., silicon oxide film of about 300 Å in thickness is formed on the monocrystal silicon layer 25a by the thermal oxidation method.

Figure 22:
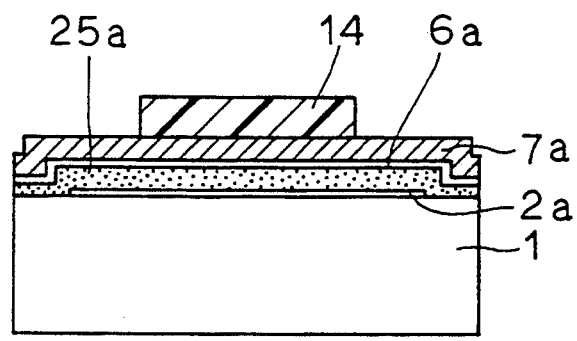
Figure 23:
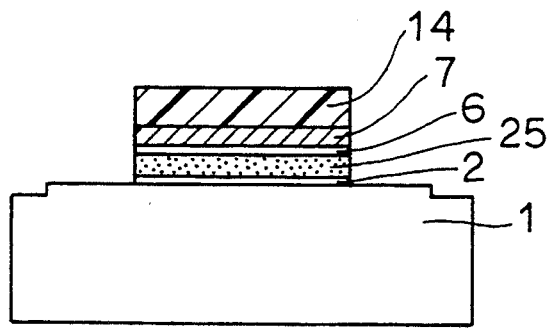

Then, as shown in FIG. 22, the polysilicon layer 7a of about 3000 Å in thickness is formed on the insulating film layer 6a by the CVD method. The resist 14 is formed on a predetermined region of the polysilicon layer 7a. Using the resist 14 as a mask, anisotropic etching is effected on the polysilicon layer 7a, insulating film layer 6a, monocrystal silicon layer 25a and gate oxide film layer 2a to form the gate oxide film 2, floating gate electrode 25, i.e., monocrystal silicon layer, insulating film 6 and control gate electrode 7 as shown in FIG. 23. Thereafter, the resist 14 is removed.

Figure 24:
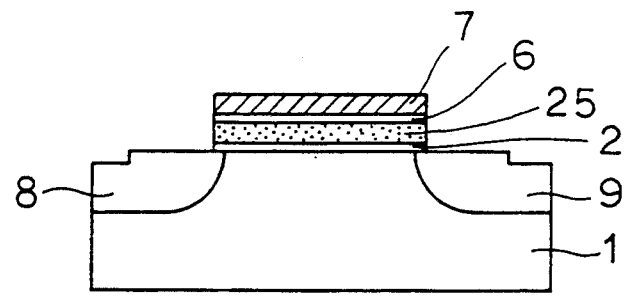

As shown in FIG. 24, impurity of which conductivity type is opposite to that of the silicon substrate 1 is ion-implanted into the silicon substrate 1 under the implanting condition of $3 \times 10^{15}/cm^2$ using the control gate electrode 7 as a mask. The impurity thus implanted is diffused by the thermal diffusion technique. Thereby, the source impurity diffusion layer 8 and drain impurity diffusion layer 9 are formed.

Figure 25:
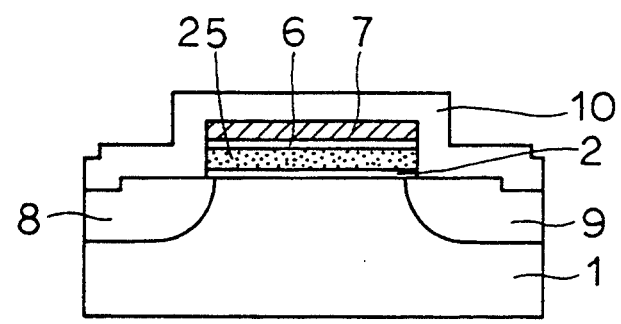
Figure 26:
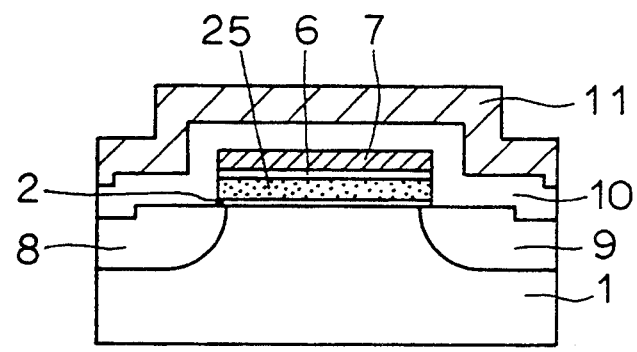
Figure 27:
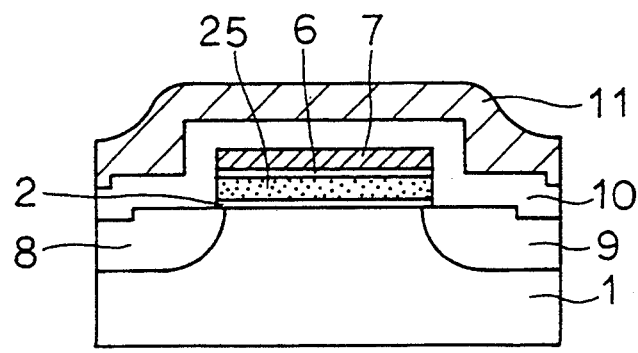

Then, as shown in FIG. 25, the interlayer thermal oxidation film 10 of about 3000 Å in thickness is formed to cover the silicon substrate 1, floating gate electrode 25 and control gate electrode 7. As shown in FIG. 26, the interlayer insulating film 11 of about 7000 Å in thickness is formed over the interlayer thermal oxidation film 10. As shown in FIG. 27, heat treatment, e.g., in a reflow method is effected to flatten the interlayer insulating film 11 for the purpose of improving the workability of the metal interconnection layer 12, which will be described later.

Figure 28:
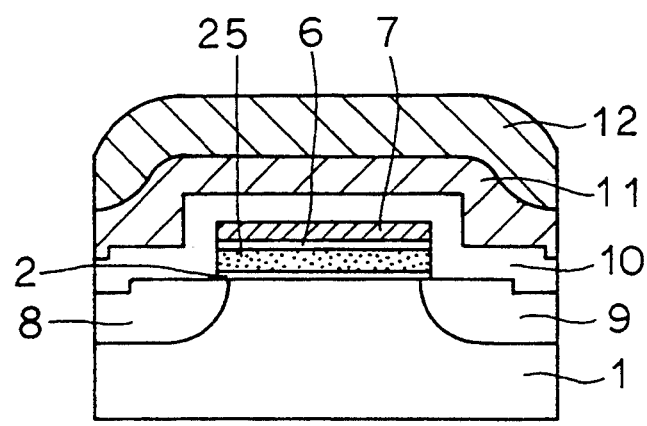

Finally, as shown in FIG. 28, the metal interconnection layer 12 of about 10000 Å in thickness, which forms an electrical connection (not shown) to the drain impurity diffusion layer 9, is formed on the interlayer insulating film 11 by the spatter method.

Figure 29:
FIGS. 29-42 are cross sections showing 1st to 14th steps of a process of manufacturing a memory cell part of a flash EEPROM of a third embodiment of the invention.
Figure 30:
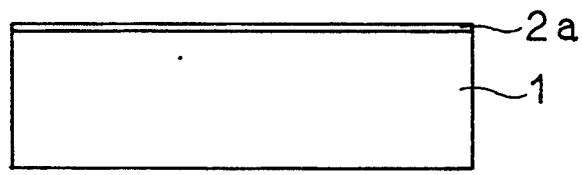
Figure 31:
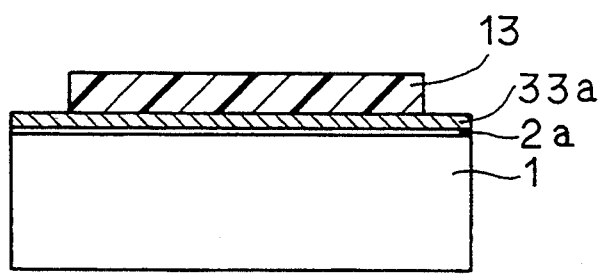

Then, a third embodiment of the manufacturing process of the invention will be described below with reference to FIGS. 29–42. As shown in FIGS. 29 and 30, the gate oxide film layer 2a of about 120 Å in thickness is formed on the silicon substrate 1 using the thermal oxidation technique. As shown in FIG. 31, a polysilicon layer 33a of about 1000 Å in thickness is formed on the gate oxide film layer 2a using the CVD method under the conditions of pressure of about 0.3 to 0.4 Torr and temperature of about 900° C. The resist 13 is formed on a predetermined region of the first polysilicon layer 33a.

Figure 32:
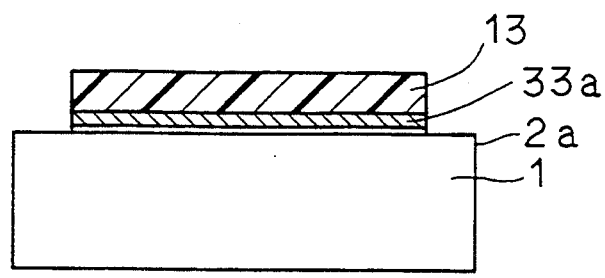

Using the resist 13 as a mask, anisotropic etching is effected on the polysilicon layer 33a and gate oxide film layer 2a to expose the surface of the silicon substrate 1, as shown in FIG. 32. Thereafter, the resist 13 is removed.

Figure 33:
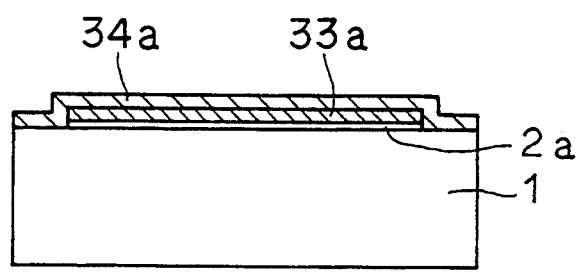
Figure 34:
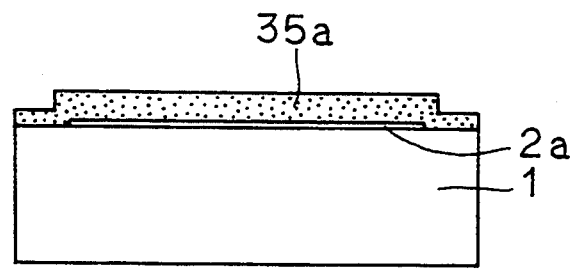

Then, as shown in FIG. 33, an amorphous silicon layer 34a of about 1000 Å in thickness is formed on the exposed portion of the surface of the silicon substrate 1 and the polysilicon layer 33a by the CVD method under the conditions of the temperature of about 550° C. and the pressure of about 0.3 to 0.4 Torr. Thereafter, the laser anneal method, heat treatment method or lamp heating method is utilized to heat and melt the amorphous silicon layer 34a and polysilicon layer 33a at the temperature of 1420° C. or more for effecting the monocrystallization utilizing a silicon (monocrystal) substrate 101 as seed crystal. In this third embodiment, the first layer is formed of the polysilicon layer 33a, and the second layer is formed of the amorphous silicon layer 34a which can be crystallized more easily that the polysilicon layer 33a. Thereby, a time period for monocrystallization of the polysilicon layer 33a and amorphous silicon layer 34a can, be shorter than that in the manufacturing process of the first embodiment shown in FIGS. 1–14. Also in this third embodiment, the resist 13 is not formed directly on the gate oxide film layer 2a for the step of exposing the silicon substrate 1, which is similar to the first and second embodiments, but is formed on the polysilicon layer 33a, so that impurity such as sodium or phosphorus in the resist 13 does not enter the gate oxide film layer 2a. As a result, such a disadvantage can be prevented that impurity enters the gate oxide film layer 2a and is gathered at the surface of the silicon substrate 1, and thereby the threshold voltage $V_{TH}$ of the memory cell transistor changes. Therefore, the over-erase phenomenon which may be caused by the change of threshold voltage $V_{TH}$ can be effectively prevented.

Figure 35:
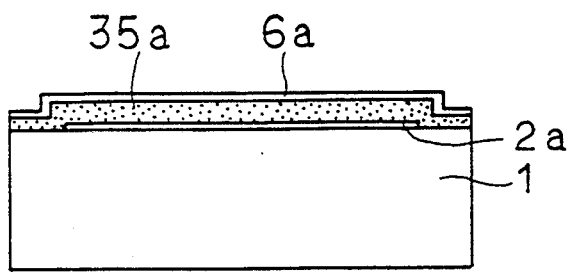

Then, as shown in FIG. 35, the insulating film layer 6a, i.e., silicon oxide film of about 300 Å in thickness is formed on the monocrystal silicon layer 35a by the thermal oxidation technique.

Figure 36:
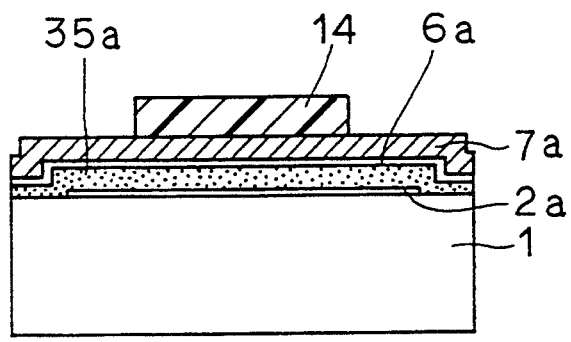
Figure 37:
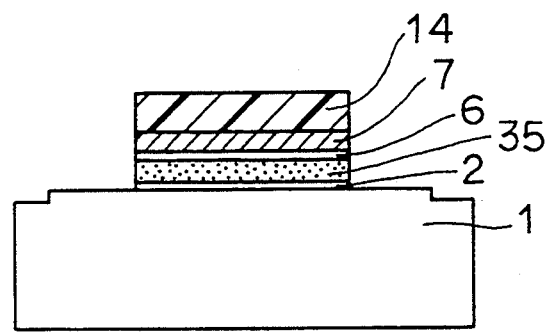

Then, as shown in FIG. 36, the polysilicon layer 7a of about 3000 Å in thickness is formed on the insulating film layer 6a by the CVD method. The resist 14 is formed on a predetermined region of the polysilicon layer 7a. Using the resist 14 as a mask, anisotropic etching is effected on the polysilicon layer 7a, insulating film layer 6a, monocrystal silicon layer 35a and gate oxide film layer 2a to form the gate oxide film 2, floating gate electrode 5, insulating film 6 and control gate electrode 7 as shown in FIG. 37. Thereafter, the resist 14 is removed.

Figure 38:
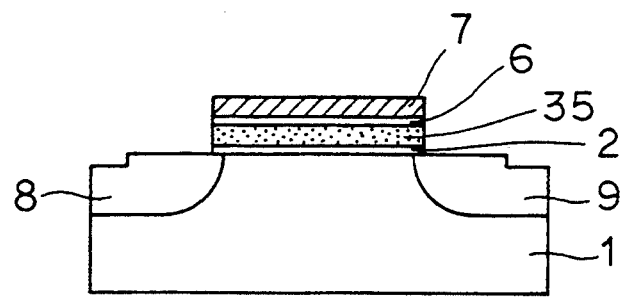

As shown in FIG. 38, impurity of which conductivity type is opposite to that of the silicon substrate 1 is ion-implanted into the silicon substrate 1 under the implanting condition of $3 \times 10^{15}/cm^2$ using the control gate electrode 7 as a mask. The impurity thus implanted is diffused by the thermal diffusion technique to form the source impurity diffusion layer 8 and drain impurity diffusion layer 9.

Figure 39:
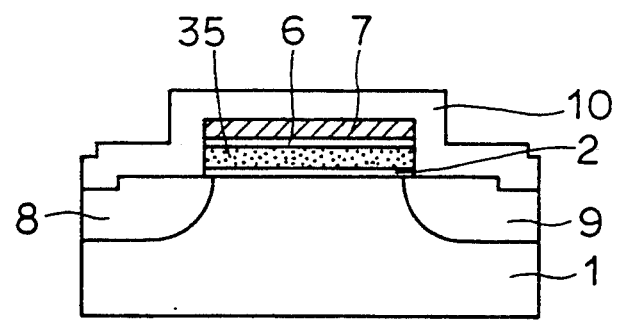

As shown in FIG. 39, the interlayer thermal oxidation film 10 covering the silicon substrate 1, floating gate electrode 35 and control gate electrode 7 is formed to have a thickness of about 3000 Å.

Figure 40:
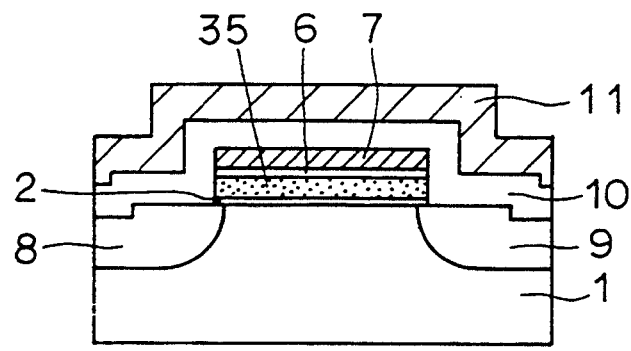
Figure 41:
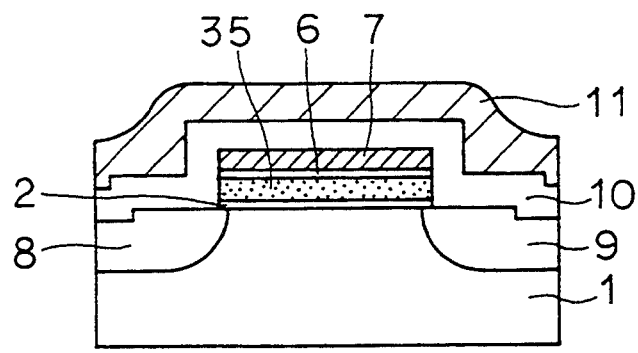
Figure 42:
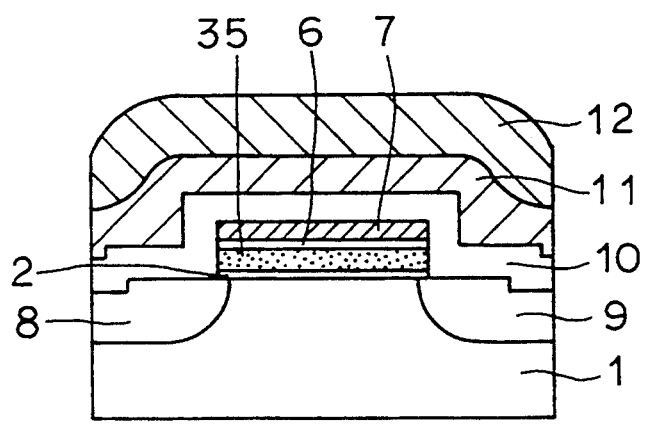

As shown in FIG. 40, the interlayer insulating film 11 of about 7000 Å in thickness is formed on the interlayer thermal oxidation film 10. As shown in FIG. 41, heat treatment is effected to flatten the interlayer insulating film 11 for the purpose of improving the workability of the metal interconnection layer 12, which will be described later.

Finally, the metal interconnection layer 12 of about 10000 Å in thickness, which forms the electrical connection (not shown) to the drain impurity diffusion layer 9, is formed on the interlayer insulating film 11 by the spatter method.

Figure 43:
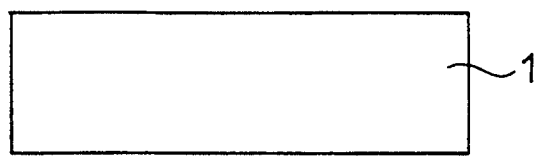
FIGS. 43-56 are cross sections showing 1st to 14th steps of a process of manufacturing a memory cell part of a flash EEPROM of a fourth embodiment of the invention.
Figure 44:
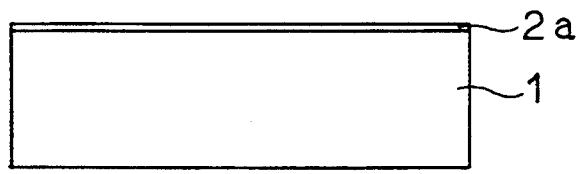

Then, the manufacturing process of a fourth embodiment will be described below with reference to FIGS. 43–56. As shown in FIGS. 43 and 44, the gate oxide film layer 2a of about 120Å in thickness is formed on the silicon substrate 1 using the thermal oxidation technique.

Figure 45:
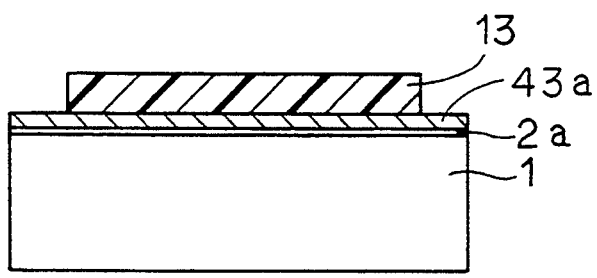

As shown in FIG. 45, an amorphous silicon layer 43a of about 1000Å in thickness is formed on the gate oxide film layer 2a by the CVD method under the conditions of temperature of about 550° C. or less and pressure of about 0.3 to 0.4 Torr. The resist 13 is formed on a predetermined region of the amorphous silicon layer 43a.

Figure 46:
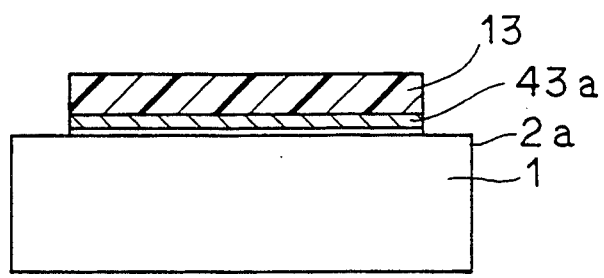

Using the resist 13 as a mask, anisotropic etching is effected on the amorphous silicon layer 43a and gale oxide film layer 2a to expose the surface of the silicon substrate 1, as shown in FIG. 46.

Figure 47:
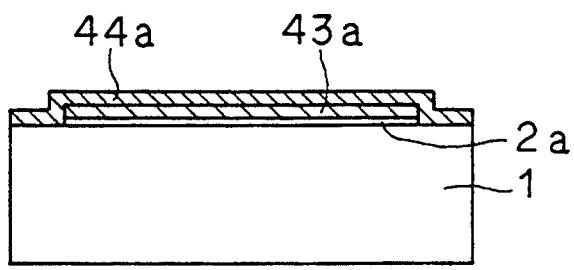
Figure 48:
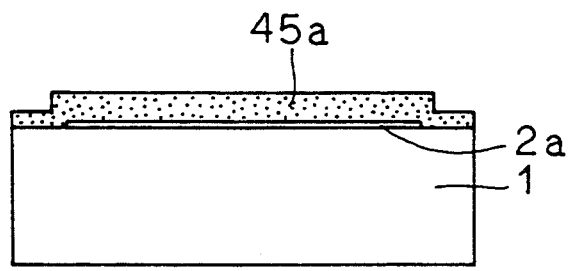

Then, as shown in FIG. 47, a polysilicon silicon layer 44a of about 1000Å in thickness is formed on the exposed portion of the surface of the silicon substrate 1 and the amorphous silicon layer 43a by the CVD method under the conditions of temperature of about 900° C. and pressure of about 0.3 to 0.4 Torr. Thereafter, the laser anneal method, heat treatment method or lamp heating method is utilized to heat and melt the polysilicon layer 44a and amorphous silicon layer 43a at the temperature of 1420° C. or more for effecting the monocrystallization utilizing the silicon (monocrystal) substrate 1 as seed crystal. Thereby, monocrystal silicon layer 45a shown in FIG. 48 is obtained. In this fourth embodiment, the first layer is formed of the amorphous silicon layer 43a, and the second layer is formed of the polysilicon layer 44a, whereby possible damage against the silicon substrate 1 can be suppressed. More specifically, since the amorphous silicon layer 43a is produced at a relatively low temperature of about 550° C. or less, possible damage against the silicon substrate 1 can be suppressed compared with the polysilicon layer which requires 900° C. for its formation. Also in this fourth embodiment, the resist 13 is not formed directly on the gate oxide film layer 2a, which is similar to the first to third embodiments, but is formed on the amorphous silicon layer 43a, so that impurity such as sodium or phosphorus in the resist 13 does not enter the gate oxide film layer 2a. As a result, such a disadvantage can be prevented that impurity enters the gate oxide film layer 2a and is gathered at the surface of the silicon substrate 1, and thereby the threshold voltage $V_{TH}$ of the memory cell transistor changes. Therefore, the over-erase phenomenon which may be caused by the change of threshold voltage $V_{TH}$ can be effectively prevented.

Figure 49:
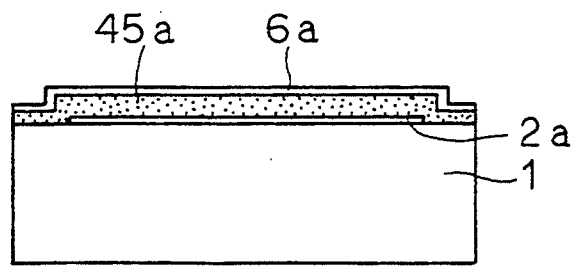

After the formation of the monocrystal silicon layer 45a, the insulating film layer 6a, i.e., silicon oxide film of about 300 Å in thickness is formed on the monocrystal silicon layer 45a by the thermal oxidation method as shown in FIG. 49.

Figure 50:
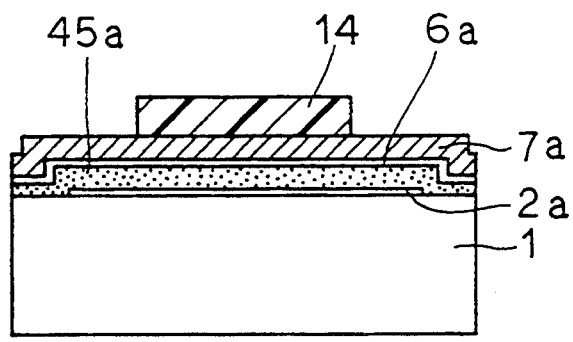
Figure 51:
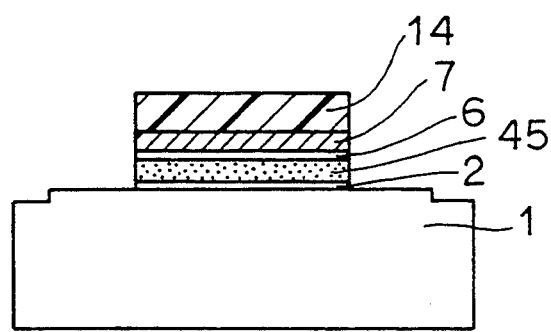

Then, as shown in FIG. 50, the polysilicon layer 7a of about 3000 Å in thickness is formed on the insulating film layer 6a by the CVD method. The resist 14 is formed on a predetermined region of the polysilicon layer 7a. Using the resist 14 as a mask, anisotropic etching is effected on the polysilicon layer 7a, insulating film layer 6a, monocrystal silicon layer 45a and gate oxide film layer 2a to form the gate oxide film 2, floating gate electrode 45, insulating film 6 and control gate electrode 7 as shown in FIG. 51. Thereafter, the resist 14 is removed.

Figure 52:
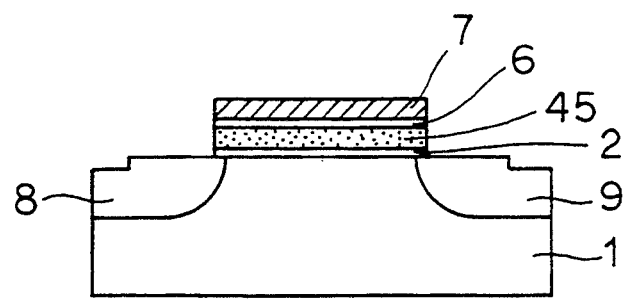

As shown in FIG. 52, impurity of which conductivity type is opposite to that of the silicon substrate 1 is ion-implanted in a self-aligned manner into the silicon substrate 1 under the implanting condition of $3 \times 10^{15}/cm^2$ using the control gate electrode 7 as a mask. The impurity thus implanted is diffused by the thermal diffusion technique to form the source impurity diffusion layer 8 and drain impurity diffusion layer 9.

Figure 53:
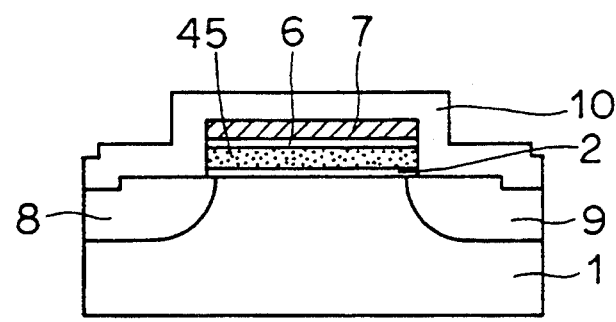

As shown in FIG. 53, the interlayer thermal oxidation film 10 covering the silicon substrate 1, floating gate electrode 45 and control gate electrode 7 is formed to have a thickness of about 3000 Å.

Figure 54:
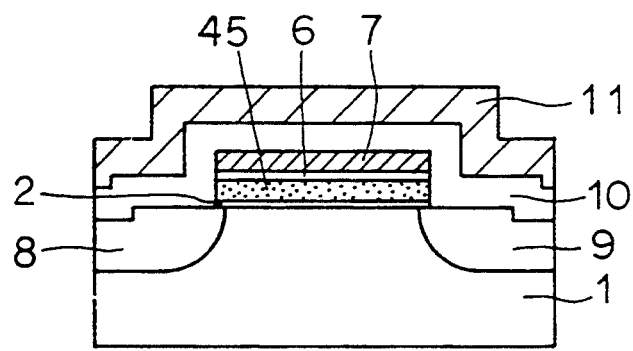
Figure 55:
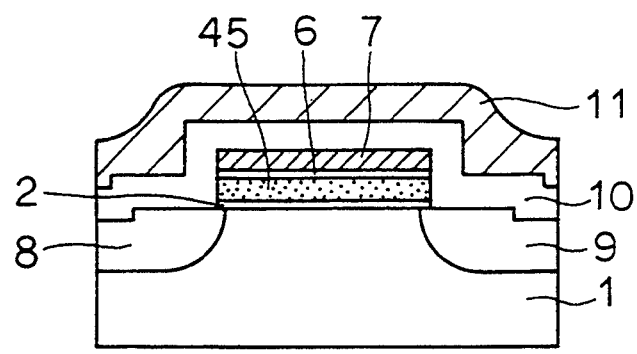

As shown in FIG. 54, the interlayer insulating film 11 of about 7000 Å in thickness is formed on the interlayer thermal oxidation film 10. Heat treatment is effected on the interlayer insulating film 11 to improve flatness of the interlayer insulating film 11 for the purpose of improving the workability of the metal interconnection layer 12, which will be described later. Thereby, the interlayer insulating film 11 has the configuration shown in FIG. 55.

Figure 56:
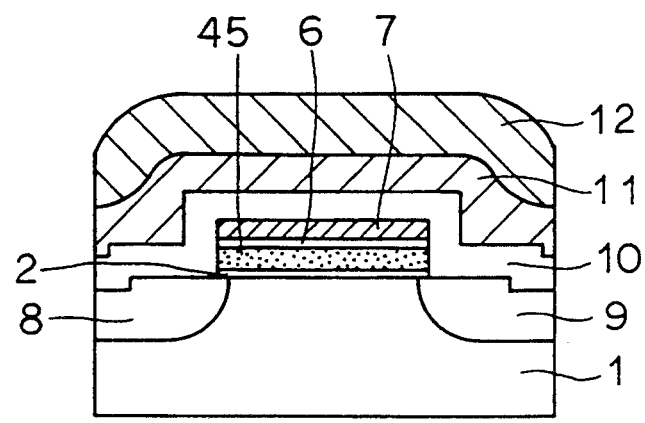
Figure 57:
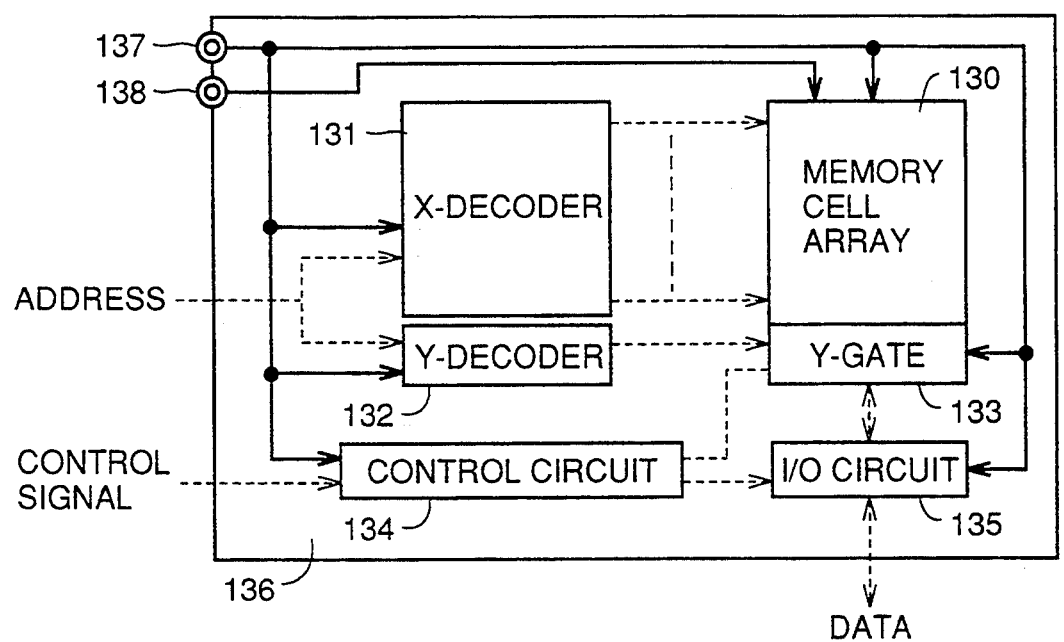
FIG. 57 is a block diagram showing a general structure of a conventional flash EEPROM.
Figure 58:
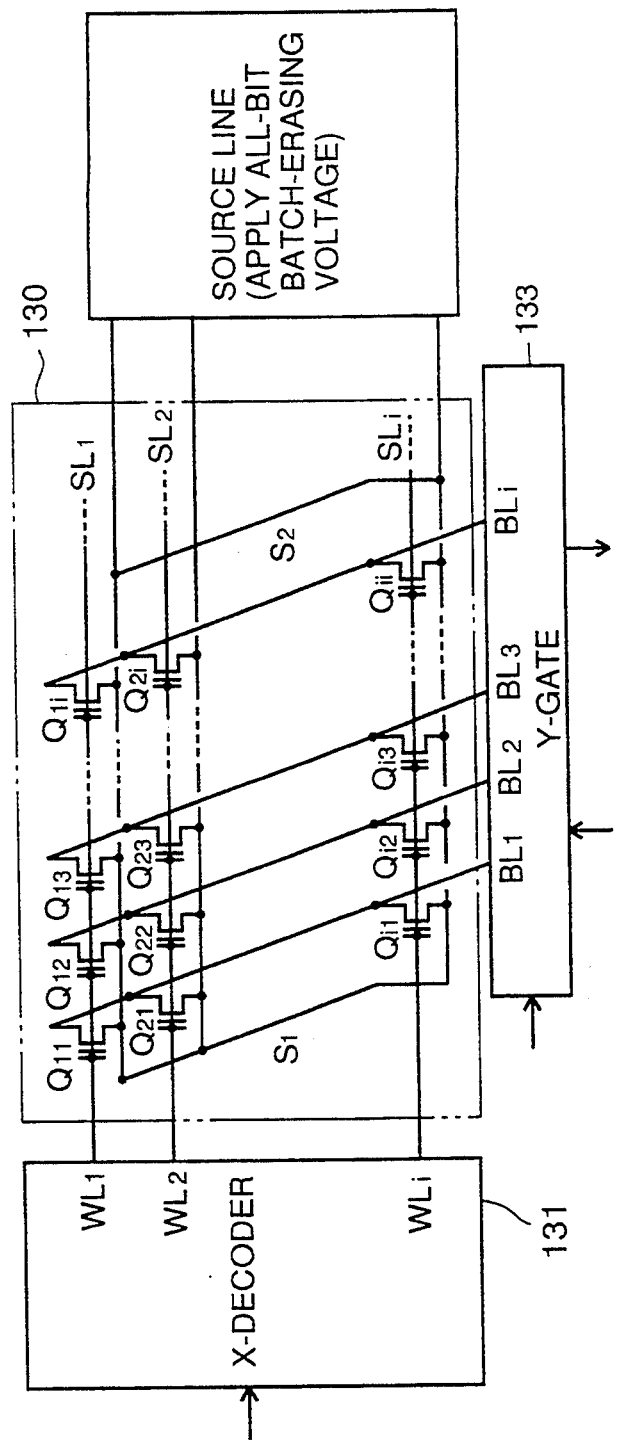
FIG. 58 is an equivalent circuit diagram showing a schematic structure of a conventional memory cell array 130 shown in FIG. 57.
Figure 59:
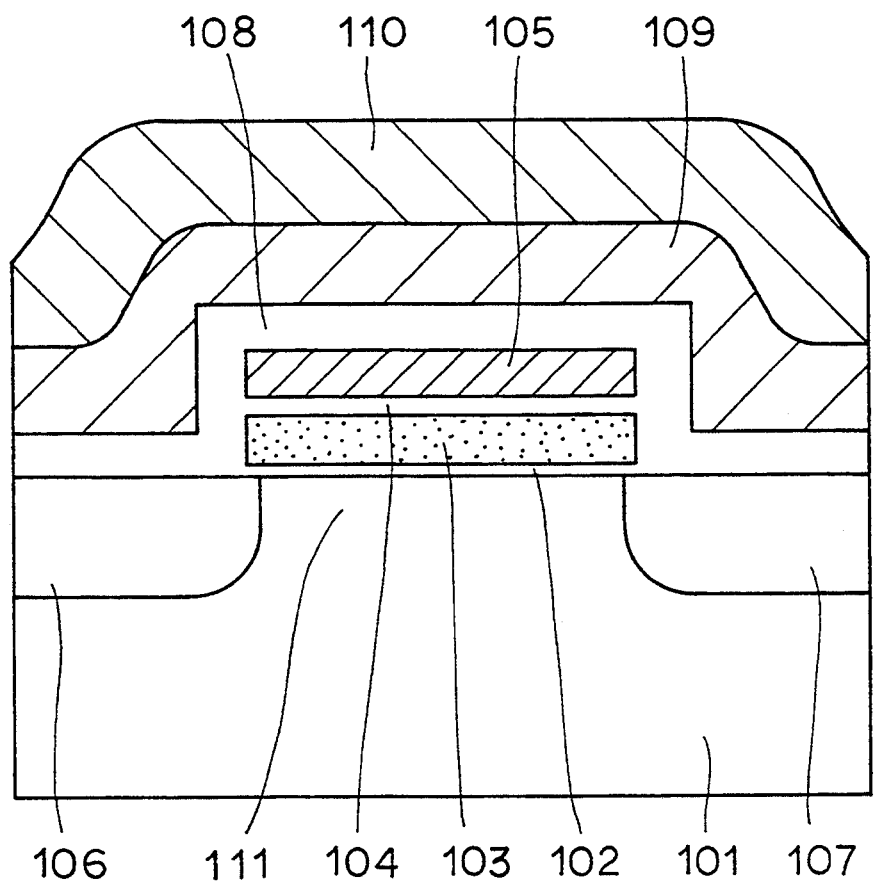
FIG. 59 is a cross section showing a memory cell part of the conventional flash EEPROM.
Figure 60:
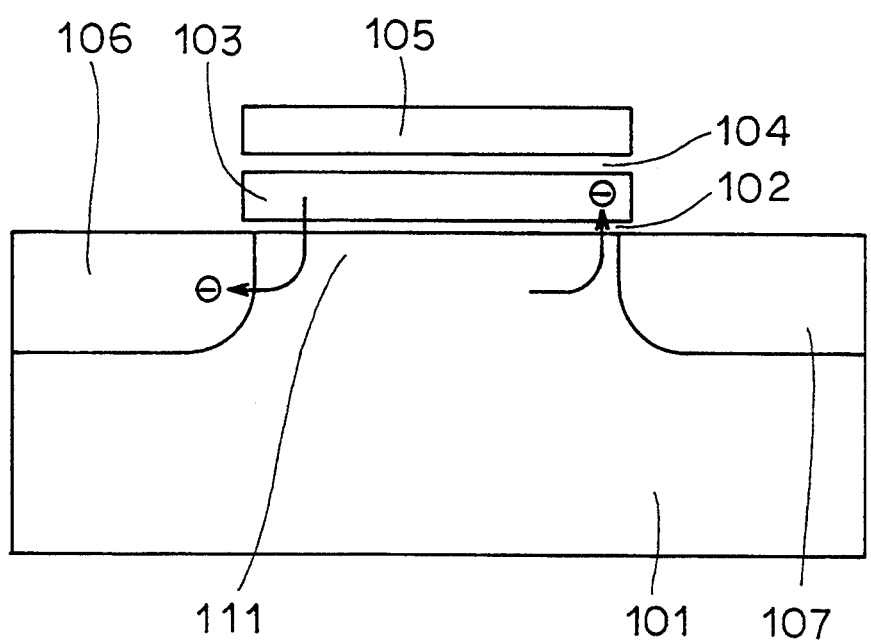
FIG. 60 is a cross section for showing writing, erasing and reading operations of data of the conventional flash EEPROM.
Figure 61:
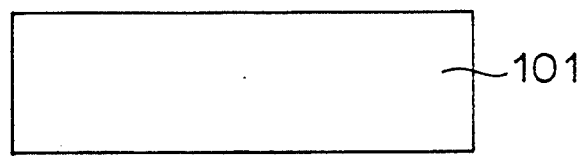
FIGS. 61-71 are cross sections showing 1st to 11th steps of a process of manufacturing the memory cell part of the conventional flash EEPROM.
Figure 62:
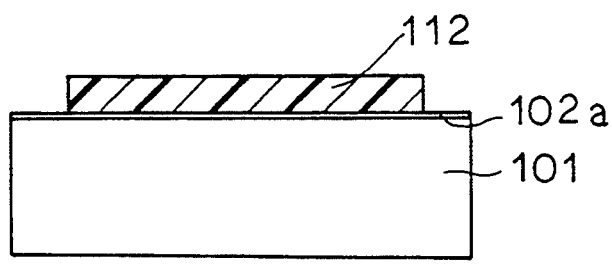
Figure 63:
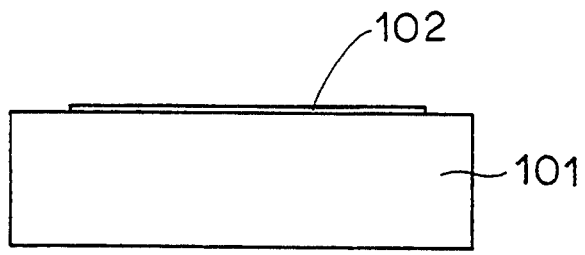
Figure 64:
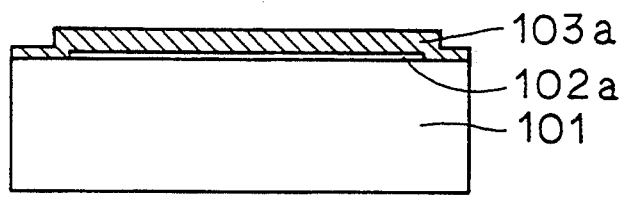
Figure 65:
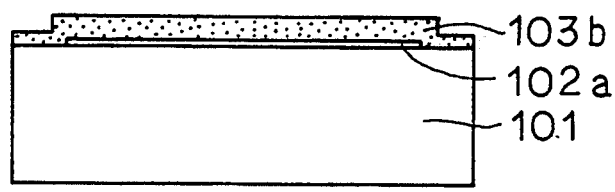
Figure 66:
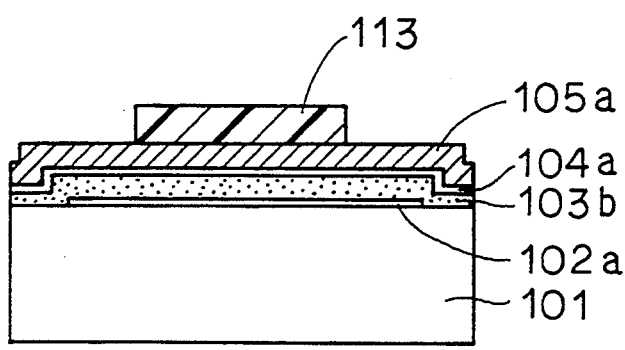
Figure 67:
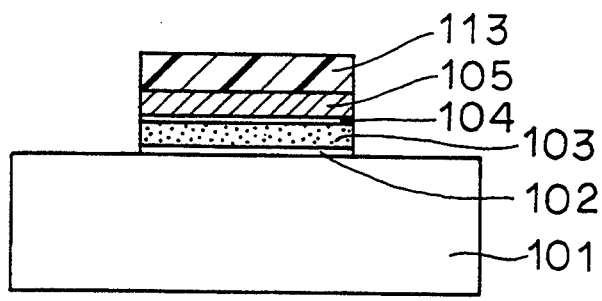
Figure 68:
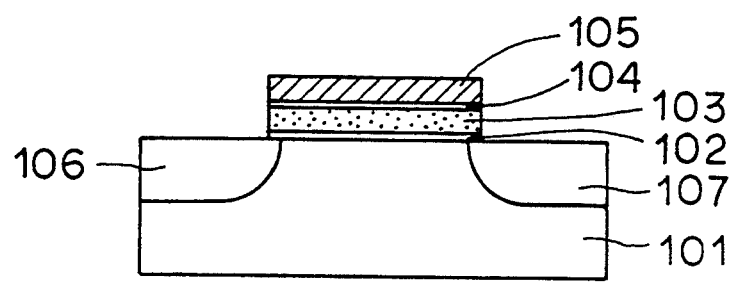
Figure 69:
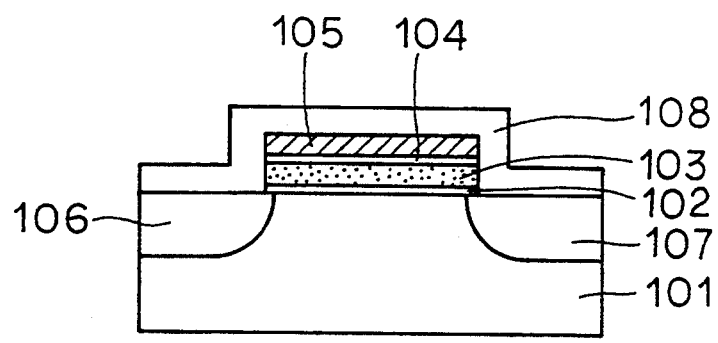
Figure 70:
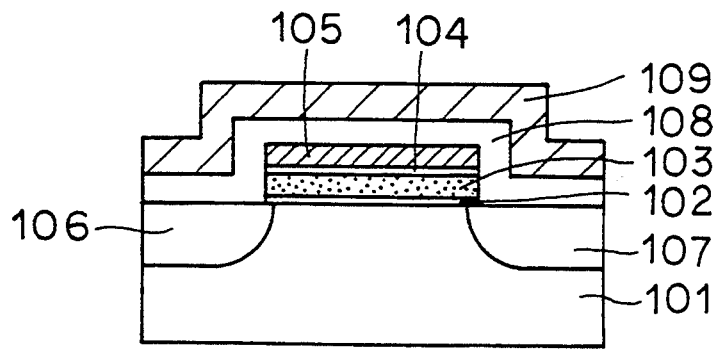
Figure 71:
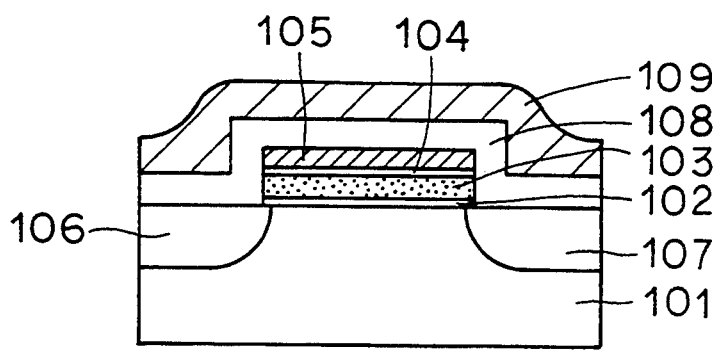
Figure 72:
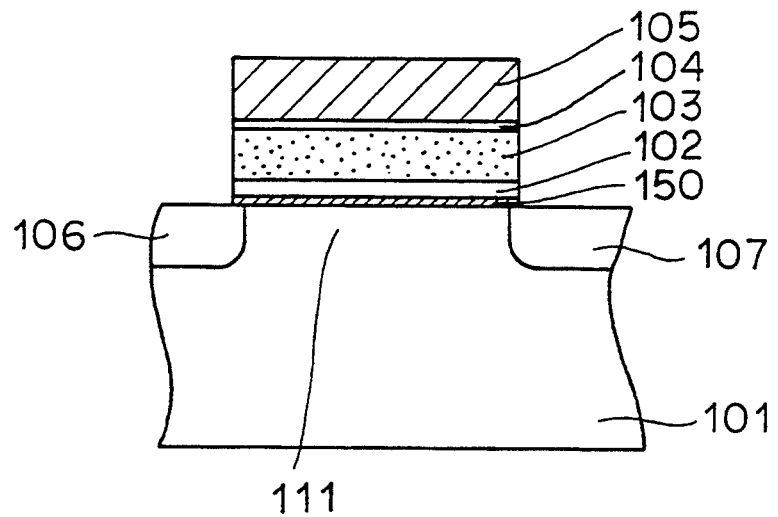
FIG. 72 is a cross section for showing a problem in a conventional process of manufacturing the memory cell part of the flash EEPROM.

Finally, the metal interconnection layer 12 of about 10000 Å in thickness, which forms the electrical connection (not shown) to the drain impurity diffusion layer 9, is formed on the interlayer insulating film 11 by the spatter method as shown in FIG. 56.

According to the method of manufacturing the semiconductor device of the invention, as described hereinbefore, the insulating film is formed on the silicon substrate, first non-monocrystal silicon layer is formed on the insulating film, and the first non-monocrystal silicon layer and the insulating film are patterned to expose the predetermined portion of the surface of the silicon substrate. Therefore, in the steps for patterning the surface of the silicon substrate, the resist is not formed directly on the insulating film, contrarily to the prior art, but the resist is formed on the first non-monocrystal silicon layer. Therefore, impurity such as sodium and phosphorus in the resist does not enter the insulating film. Thereby, such a disadvantage can be prevented that the threshold voltage $V_{TH}$ of the memory cell transistor changes due to the fact the impurity enters the insulating film and is gathered at the surface of the silicon substrate. As a result, the over-erase phenomenon which may be caused by the change of threshold voltage can be effectively prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device comprising the steps of:
    forming an insulating film on a silicon substrate;
    forming a first non-monocrystal silicon layer on said insulating film;
    patterning said first non-monocrystal silicon layer and said insulating film to expose a portion of a surface of said silicon substrate;
    forming a second non-monocrystal silicon layer on said first non-monocrystal silicon layer and the exposed portion of said surface of said silicon substrate, and;
    heating and melting said first non-monocrystal silicon layer and said second non-monocrystal silicon layer for monocrystallization of said first non-monocrystal silicon layer and said second non-monocrystal silicon layer.

2. The method of manufacturing the semiconductor device according to claim 1, wherein
    said step of patterning said first non-monocrystal silicon layer and said insulating film includes the step of forming a resist on a region of said first non-monocrystal silicon layer and thereafter effecting anisotropic etching on said first non-monocrystal silicon layer and said insulating film using said resist as a mask.

3. The method of manufacturing the semiconductor device according to claim 1, wherein
    both of said first non-monocrystal silicon layer and said second non-monocrystal silicon layer are polysilicon layers.

4. The method of manufacturing the semiconductor device according to claim 1, wherein
    said first non-monocrystal silicon layer is a polysilicon layer, and said second non-monocrystal silicon layer is an amorphous silicon layer.

5. The method of manufacturing the semiconductor device according to claim 1, wherein
    both of said first non-monocrystal silicon layer and said second non-monocrystal silicon layer are amorphous silicon layers.

6. The method of manufacturing the semiconductor device according to claim 1, wherein
    said first non-monocrystal silicon layer is an amorphous silicon layer, and said second non-monocrystal silicon layer is a polysilicon layer.

7. The method of manufacturing the semiconductor device according to claim 3, wherein
    said polysilicon layer is formed by the CVD method under the conditions of temperature of about 900° C. and pressure in a range from about 0.3 to about 0.4 Torr.

8. The method of manufacturing the semiconductor device according to claim 4, wherein
    said amorphous silicon layer is formed by the CVD method under the conditions of temperature of about 550° C. or less and pressure in a range from about 0.3 to about 0.4 Torr.

9. The method of manufacturing the semiconductor device according to claim 1, wherein
said first non-monocrystal silicon layer has a thickness of about 1000 Å, and said second non-monocrystal silicon layer has a thickness of about 1000 Å.

10. The method of manufacturing the semiconductor device according to claim 4, wherein
said polysilicon layer is formed by the CVD method under the conditions of temperature of about 900° C. and pressure in a range from about 0.3 to about 0.4 Torr.

11. The method of manufacturing the semiconductor device according to claim 6, wherein
said polysilicon layer is formed by the CVD method under the conditions of temperature of about 900° C. and pressure in a range from about 0.3 to about 0.4 Torr.

* * * * *